United States Patent
Ryu et al.

(10) Patent No.: US 8,053,351 B2
(45) Date of Patent: Nov. 8, 2011

(54) METHOD OF FORMING AT LEAST ONE BONDING STRUCTURE

(75) Inventors: Hwang-Bok Ryu, Asan-si (KR);
Ky-Hyun Jung, Cheonan-si (KR);
Jae-Yong Park, Cheonan-si (KR);
Ho-Geon Song, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/903,714

(22) Filed: Oct. 13, 2010

(65) Prior Publication Data

US 2011/0136334 A1    Jun. 9, 2011

(30) Foreign Application Priority Data

Dec. 3, 2009  (KR) .................. 10-2009-0119223

(51) Int. Cl.
*H01L 21/60*   (2006.01)

(52) U.S. Cl. ..................... 438/617; 228/155; 228/4.5

(58) Field of Classification Search .................... 29/879; 228/155, 4.5; 438/617; 257/E21.519, E21.506
See application file for complete search history.

(56) References Cited

U.S. PATENT DOCUMENTS

| 7,188,759 B2 | 3/2007 | Calpito et al. |
| 2006/0054665 A1 | 3/2006 | Calpito et al. |

FOREIGN PATENT DOCUMENTS

| JP | 04-255237 A | 9/1992 |
| KR | 10-2008-0037845 A | 5/2008 |

*Primary Examiner* — George Fourson, III
(74) *Attorney, Agent, or Firm* — Harness, Dickey & Pierce, P.L.C.

(57) ABSTRACT

A method of forming at least one bonding structure may be provided. A ball may be formed on the front end of a wire outside a capillary. The capillary may be moved downwardly to form a preliminary compressed ball on a first pad using the ball. The capillary may be moved upwardly to form a neck portion on the preliminary compressed ball using the preliminary compressed ball and the wire. The capillary may be moved obliquely and downwardly to form a compressed ball. The capillary may extend the wire from the compressed ball to a second pad.

16 Claims, 6 Drawing Sheets

METHOD OF FORMING AT LEAST ONE BONDING STRUCTURE

CROSS-REFERENCE TO RELATED APPLICATION

This application claims priority under 35 U.S.C. §119 to Korean Patent Application No. 10-2009-0119223 filed on Dec. 3, 2009 in the Korean Intellectual Property Office (KIPO), the entire contents of which are herein incorporated by reference.

BACKGROUND

1. Field

Example embodiments relate to a method of forming at least one bonding structure, and more particularly, to a method of forming at least one bonding structure that connects a bonding pad of a semiconductor chip to an electrode pad of a wiring board in a semiconductor packaging process. Example embodiments also relate to a semiconductor device.

2. Description of Related Art

Technology for mounting semiconductor chips on a wiring board in a semiconductor packaging process is attracting attention since such technology may allow for highly integrated semiconductor packages. In the conventional art, semiconductor chips are vertically stacked and mounted on the wiring board, and thus an interval between the semiconductor chips narrows. In this case, electrical defects caused by short circuits between bonding structures which connects an electrode pad of the wiring board with a bonding pad of each of the semiconductor chips are relatively common due to the respective bonding structures having a height of above 30 μm from an upper surface of the bonding pad of the respective semiconductor chips.

SUMMARY

Example embodiments provide a method of forming at least one bonding structure having a relatively low height. Example embodiments also relate to a semiconductor device including the at least one bonding structure having the relatively low height.

In accordance with example embodiments, a method of forming at least one bonding structure may include forming a ball at a front end of a wire outside a capillary, vertically moving the ball, the wire, and the capillary downwardly to attach the ball to one side of a first pad, pressing the capillary against a center of the ball to form a preliminary compressed ball and a neck portion extending from the preliminary compressed ball, vertically moving the capillary upwardly to expose the preliminary compressed ball and the neck portion, obliquely moving the capillary downwardly with respect to the neck portion to compress the neck portion toward an edge of the preliminary compressed ball to form a compressed ball, the compressed ball substantially covering an entire surface of the first pad and having a wrinkle on an upper surface thereof, moving the capillary from the first pad to a second pad to extend the wire from the compressed ball, and forming a rear end of the at least one bonding structure by moving the capillary towards the second pad to press the wire against the second pad.

In accordance with example embodiments, a semiconductor device may include a wiring board with an electrode pad and a semiconductor chip with a bonding pad. In example embodiments, the semiconductor chip may be on the wiring board and may be arranged to expose the electrode pad. In example embodiments the semiconductor device may include a bonding structure including a compressed ball and a wire, wherein a height of the compressed ball is about 20 to 25 um.

In example embodiments, a method of forming at least one bonding structure may include forming a ball at a front end of a wire. The wire may be installed outside a capillary. The ball may contact the wire and may be formed over a first pad. The ball, the wire and the capillary may be vertically moved downwardly to attach the ball to one side of the first pad. A center of the ball may be compressed using the capillary to form a preliminary compressed ball. The capillary may be vertically moved upwardly to from a neck portion extended from the preliminary compressed ball. The neck portion may be between the preliminary compressed ball and the wire. The capillary may be obliquely moved downwardly with respect to the neck portion to compress the neck portion toward an edge of the preliminary compressed ball and form a compressed ball. The compressed ball may substantially cover an entire surface of the first pad and may have a wrinkle on an upper surface thereof. The capillary may be moved from the first pad toward a second pad to extend the wire from the compressed ball. A rear end of the wire outside the capillary may be attached to the second pad.

In example embodiments, obliquely moving the capillary downwardly with respect to the neck portion to compress the neck portion toward the edge of the preliminary compressed ball may comprise, obliquely moving the capillary downwardly with respect the neck portion to attach the neck portion to the edge of the preliminary compressed ball, and continuously moving the capillary obliquely and downwardly with respect to the neck portion to compress the attached neck portion and the preliminary compressed ball together.

In example embodiments, the compressed ball may have a disk shape when viewing in a top view thereof and have a lower height than the preliminary compressed ball.

In example embodiments, moving the capillary from the first pad toward a second pad to extend the wire from the compressed ball may comprise, moving the capillary vertically upward, and moving the capillary parallel to an upper surface of the first pad.

In example embodiments, after the forming the compressed ball, the method may further comprise, vertically moving the capillary upwardly, and vertically moving the capillary downwardly, wherein the wire outside the capillary may be hardened by vertically moving upwardly and downwardly.

In example embodiments, compressing the center of the ball, compressing the neck portion, and attaching the rear end of the wire may be performed using a thermo-compression manner using an ultrasonic vibration.

In example embodiments, the first pad may be a bonding pad, and may electrically connect at least one semiconductor chip, in which a memory device and a logic device may be formed, with the outside.

In example embodiments, the second pad may be an electrode pad, and may electrically connect a wiring board with the first pad through the at least one bonding structure.

In example embodiments, the at least one semiconductor chip may be mounted on the wiring board to expose the second pad.

In example embodiments, in the case that the at least one semiconductor chip may be plural, and the plurality of semiconductor chips may be vertically stacked on the wiring board to expose first pads thereof. The second pad may be electrically connected with the first pads through the at least one bonding structure.

In accordance with example embodiments, a method of forming at least one bonding structure may include sequentially forming a ball and a wire outside a capillary. The capillary may be vertically moved downwardly to attach the ball to the first pad. A center of the ball may be compressed using a front end of the capillary to form a preliminary compressed ball. The capillary may be vertically moved upwardly to form a neck portion extended from the preliminary compressed ball. The capillary may be obliquely moved downwardly with respect to the neck portion to compress the neck portion toward an edge of the preliminary compressed ball and form a compressed ball. The compressed ball may have a height of about 20 to 25 um from an upper surface of the first pad. The capillary may be moved from the first pad toward a second pad to extend the wire from the compressed ball. A rear end of the wire outside the capillary may be attached to the second pad.

In example embodiments, the ball may contact the wire and may be formed under the wire and over a first pad.

In example embodiments, after the attachment of the ball to the first pad, the ball may expose one side of the first pad.

In example embodiments, the neck portion may be between the preliminary compressed ball and the wire, and may have a smaller width than the preliminary compressed ball along a direction parallel to the upper surface of the first pad.

In example embodiments, the compressed ball may substantially cover an entire upper surface of the first pad and may have a wrinkle on an upper surface thereof.

In example embodiments, the wrinkle may be formed by the compressing the center of the ball using the front end of the capillary, and the obliquely moving the capillary downwardly.

In example embodiments, compressing the center of the ball using the front end of the capillary may form at least one dent on an upper surface of the preliminary compressed ball adjacent to the neck portion.

In example embodiments, obliquely moving the capillary downwardly may form at least one dent on the upper surface of the compressed ball using the front end of the capillary.

In example embodiments, the first pad may be a bonding pad, and may electrically connect at least one semiconductor chip, in which a memory device and a logic device may be formed, with the outside.

In example embodiments, the second pad may be an electrode pad, and may electrically connect a wiring board with the first pad through the at least one bonding structure.

BRIEF DESCRIPTION OF THE DRAWINGS

The foregoing and other features and advantages will be apparent from the description of example embodiments, as illustrated in the accompanying drawings in which like reference characters refer to the same parts throughout the different views. The drawings are not necessarily to scale, emphasis instead being placed upon illustrating the principles of example embodiments. In the drawings.

DETAILED DESCRIPTION OF EXAMPLE EMBODIMENTS

Figure 1:
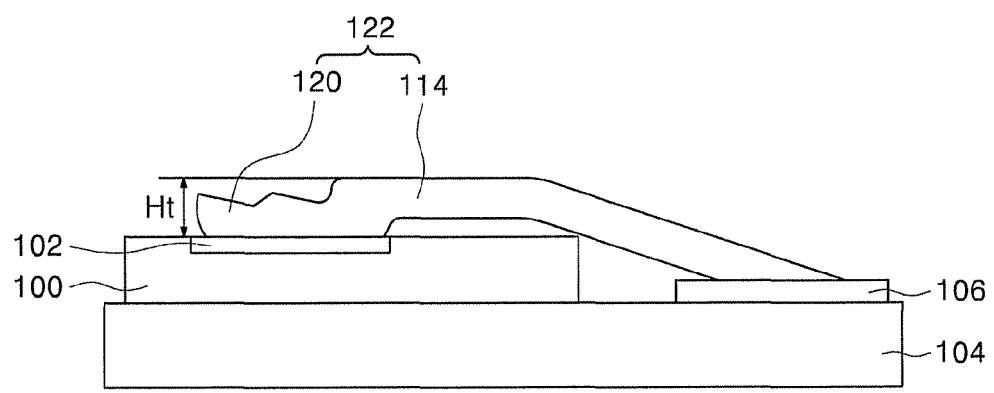
FIG. 1 is a cross-sectional view showing at least one bonding structure according to example embodiments.

Example embodiments will now be described more fully with reference to the accompanying drawings in which example embodiments are shown. The inventive concepts may, however, be embodied in different forms and should not be construed as limited to example embodiments as set forth herein. Rather, example embodiments are provided so that this disclosure is thorough and complete and fully conveys the inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other elements or layers or intervening elements or layers that may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing example embodiments only and is not intended to be limiting of the inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view showing at least one bonding structure 122 according to example embodiments. Referring to FIG. 1, the at least one bonding structure 122 may be configured to electrically connect at least one semiconductor chip 100 to at least one wiring board 104. Although FIG. 1 illustrates a single semiconductor chip 100 connected to a single wiring board 104 via the at least one bonding structure 122, example embodiments are not limited thereto. For example, the at least one bonding structure 122 may be used to bond a plurality of wiring boards 104 with each other, or with the outside. As another example, the at least one bonding structure 122 may include a first bonding structure and a second bonding structure, wherein the first bonding structure electrically connects a semiconductor chip to wiring board as illustrated in FIG. 1 and the second bonding structure electrically connects the wiring board with the outside. In the latter example, the first and second bonding structures may be identical to or similar to the at least one bonding structure 122 illustrated in FIG. 1.

In example embodiments, the at least one semiconductor chip 100 may be a memory device (not shown) or a logic device (not shown). According to example embodiments, a bonding pad 102 may be formed at an edge of the at least one semiconductor chip 100. Example embodiments, however, are not limited thereto. For example, the bonding pad 102 may be formed at a center of the at least one semiconductor chip 100.

The wiring board 104 may be a printed circuit board (PCB) or a silicon (Si) interposer. On the wiring board 104, an electrode pad 106 may be prepared.

In accordance with example embodiments, the at least one semiconductor chip 100 may be mounted on the wiring board 104. In example embodiments, the at least one semiconductor chip 100 may be arranged on the wiring board 104 to expose the electrode pad 106. Also, the at least one bonding structure 122 may electrically connect the bonding pad 102 of the at least one semiconductor chip 100 with the electrode pad 106 of the wiring board 104.

Referring again to FIG. 1, the at least one bonding structure 122 may include a compressed ball 120 and a wire 114. The compressed ball 120 and the wire 114 may be electrically connected with each other and integrated to form one body. Also, in accordance with example embodiments, an overall height $H_t$ of the at least one bonding structure 122 may be about 20 µm to about 25 µm, however, example embodiments are not limited thereto as the overall height Ht may be less than about 20 µm or greater than about 25 µm. In example embodiments, the at least one bonding structure 122 may be made of a metal, for example, gold and/or copper.

The compressed ball 120 may be attached on the bonding pad 102 of the at least one semiconductor chip 100. In accordance with example embodiments, the compressed ball 120 may be attached on the bonding pad 102 using a capillary 108 (see FIG. 2). The capillary 108 may attach the compressed ball 120 on the bonding pad 102 by a thermo-compression manner using an ultrasonic vibration 110. Example embodiments, however, are not limited to thermo-compression bonding. For example, example embodiments also include compression bonding, thermo-sonic bonding, and/or ultrasonic bonding.

In accordance with example embodiments, a lower surface of the compressed ball 120 may have a smaller area than an upper surface of the bonding pad 102. However, example embodiments are not limited thereto. For example, the lower surface of the compressed ball 120 may have substantially the same area as the upper surface of the bonding pad 102.

The compressed ball 120 may have a flat disk shape when viewing in a top view thereof and a wrinkled upper portion when viewing in a cross-sectional view thereof. The wrinkled upper portion may be determined by the front-end shape of the capillary 108 and movement of the capillary 108 while the compressed ball 120 is formed. This will be described in detail later.

In example embodiments, the front end of the wire 114 may contact the compressed ball 120 and the wire 114 may extend from the compressed ball 120. For example, the wire 114 may extend from an upper portion of one side of the compressed ball 120. Also, the wire 114 may extend substantially parallel to the upper surface of the bonding pad 102 within the at least one semiconductor chip 100.

The rear end of the wire 114 may be attached to an upper surface of the electrode pad 106 of the wiring board 104. In accordance with example embodiments, the rear end of the wire 114 may be attached to the electrode pad 106 using the capillary 108. The capillary 108 may attach the rear end of the wire 114 to the upper portion of the electrode pad 106 by the thermo-compression manner using the ultrasonic vibration 110. As indicated above, example embodiments are not limited to thermo-compression bonding. For example, example embodiments may also include compression bonding, thermo-sonic bonding, and/or ultrasonic bonding to bond the wire 114 to the upper portion of the electrode pad 106.

Also, after the attachment of the rear end of the wire 114 on the electrode pad 106, the wire 114 may be cut by applying a tension to the capillary 108.

Because the at least one bonding structure 122 may have a relatively low height compared with the conventional art, it is possible to prevent or reduce an electrical defect caused by a short circuit between bonding structures when semiconductor chips are vertically stacked on the wiring board 104.

A method of forming the bonding structure will be described in detail below.

Figure 4:
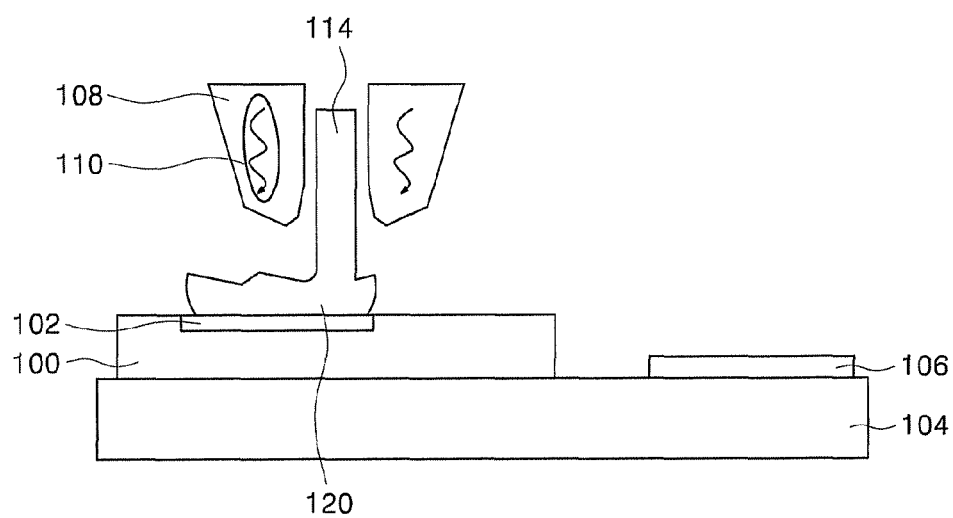
Figure 5:
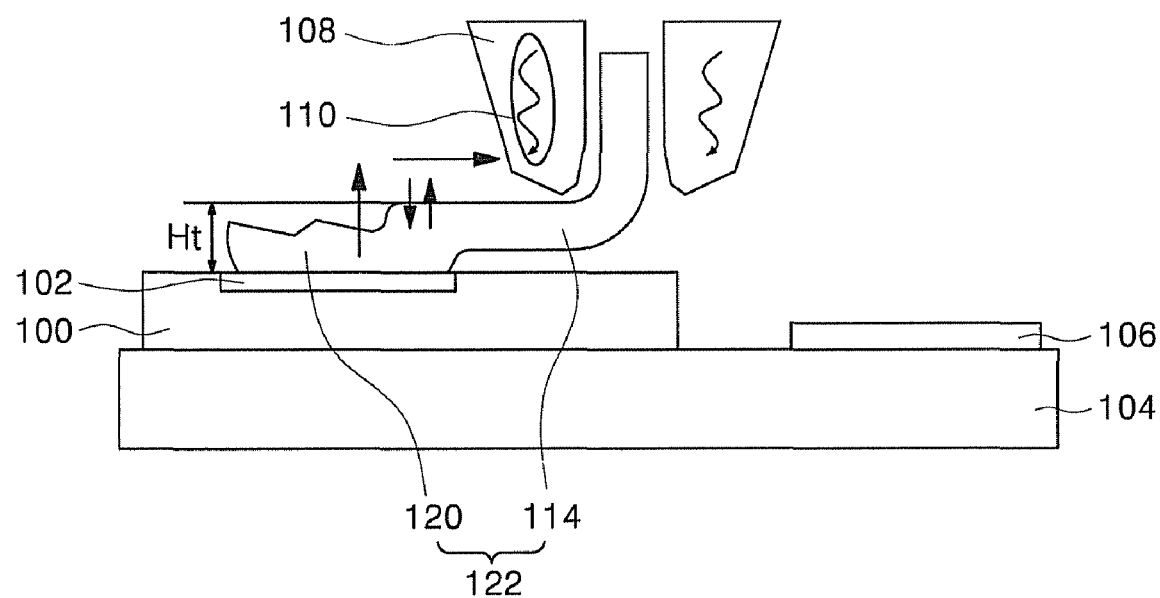
Figure 6:
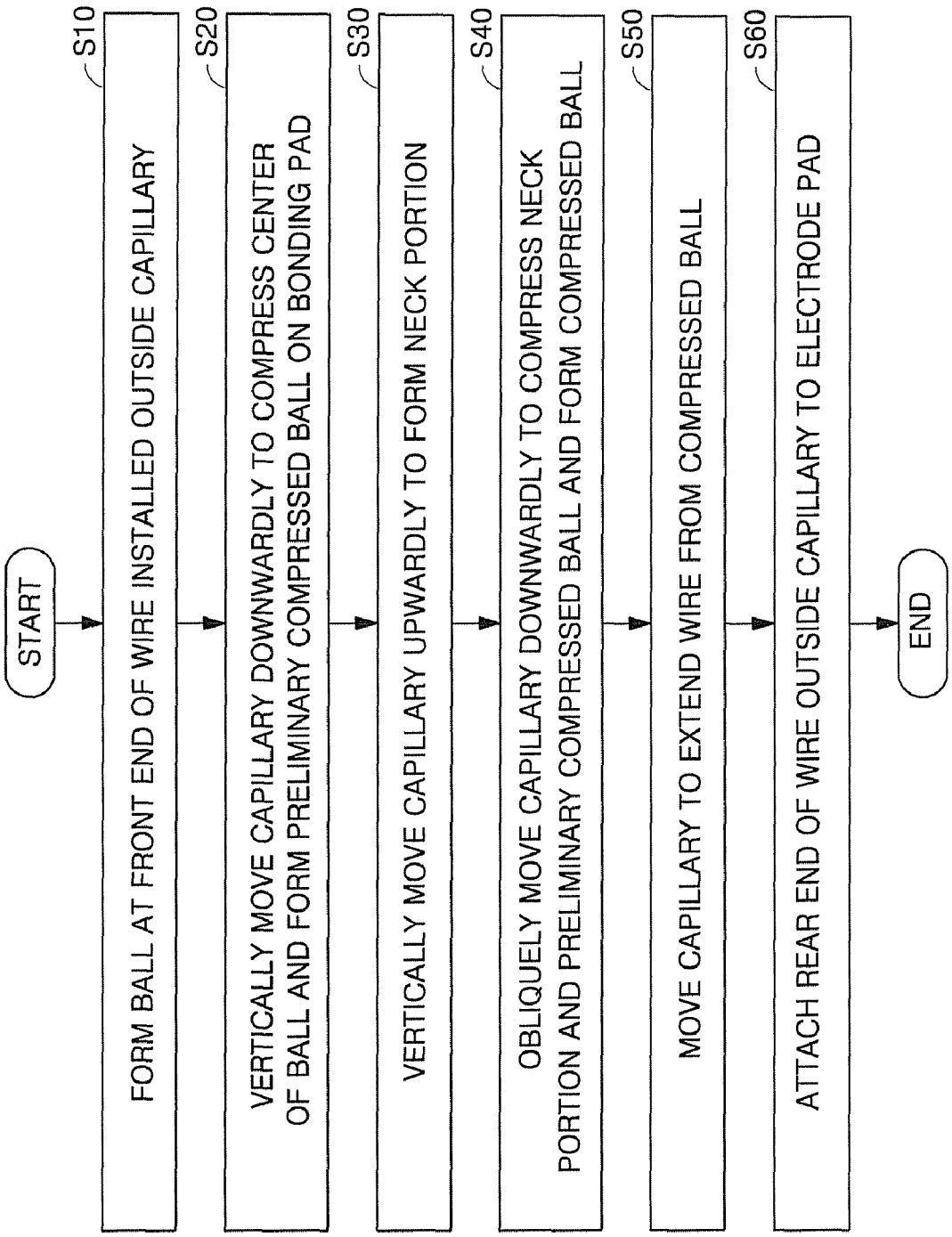
FIG. 6 is a flowchart illustrating a method of forming at least one bonding structure according to example embodiments.

FIGS. 2 to 5 are cross-sectional views illustrating a method of forming at least one bonding structure according to example embodiments, and FIG. 6 is a flowchart illustrating a method of forming at least one bonding structure according to example embodiments.

Figure 2:
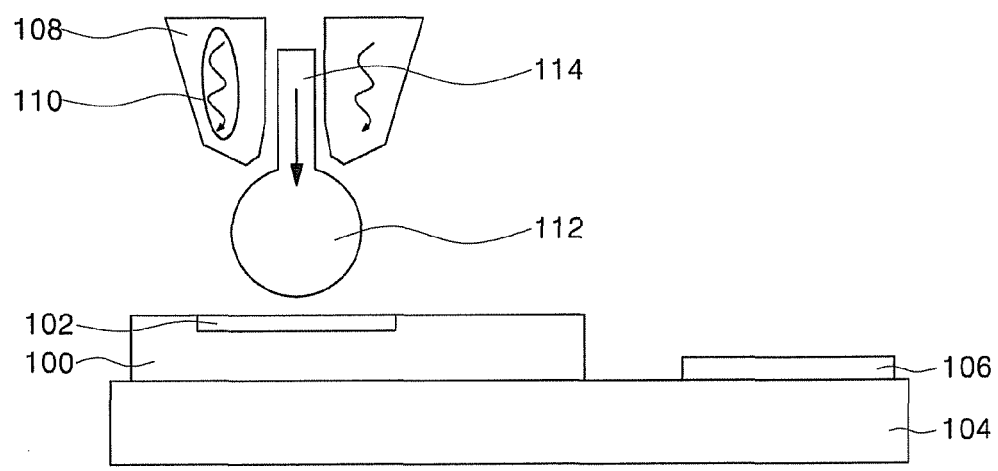
FIGS. 2 to 5 are cross-sectional views illustrating a method of forming at least one bonding structure according to example embodiments.

Referring to FIGS. 2 and 6, at least one semiconductor chip 100 is prepared. The at least one semiconductor chip 100 may have a memory device and/or a logic device and a bonding pad 102 that electrically connects the memory device and/or the logic device with the outside.

In accordance with example embodiments, the at least one semiconductor chip 100 may be mounted on a wiring board 104 on which an electrode pad 106 is formed. In example embodiments, the at least one semiconductor chip 100 may be stacked on the wiring board 104 to expose the electrode pad 106.

In accordance with example embodiments, the at least one semiconductor chip 100 may be prepared in plurality. The plurality of semiconductor chips 100 may be vertically stacked to expose the bonding pads 102 thereof, respectively. The plurality of semiconductor chips 100 may be mounted on the wiring board 104 to expose the electrode pad 106. Although the plurality of semiconductor chips 100 has been described as being vertically stacked, example embodiments are not limited thereto. For example, the semiconductor chips 100 may be arranged horizontally on the wiring board 104 and arranged so as to expose the electrode pad 106.

In example embodiments, a bonding apparatus may be prepared. The bonding apparatus may, for example, include a capillary 108. The capillary 108 may be equipped with a wire 114 which may include a metal material, for example, gold or copper.

A ball 112 may be formed at the front end of the metal wire 114 installed outside the capillary 108 (S10). The ball 112 may have a substantially spherical shape, and the wire 114 may extend from one side of the ball 112. The ball 112 and the wire 114 may be integrated to form one body outside the capillary 108. In example embodiments, the ball 112 may be formed by applying a high-voltage electric charge to the wire 114. The tip of the wire 114 forms into the ball 112 because of the surface tension of the molten metal.

Figure 3:
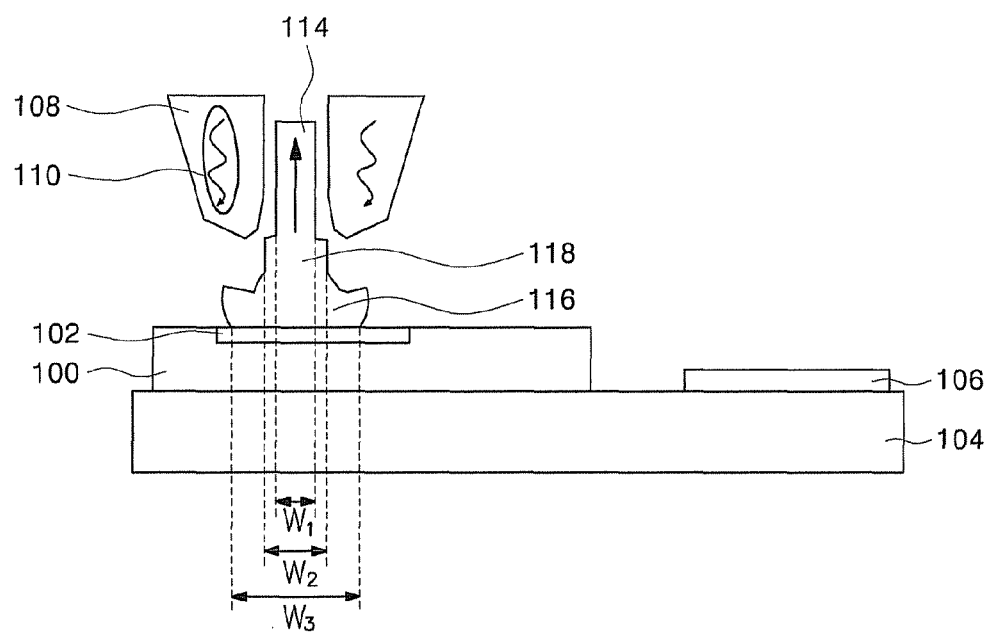

Referring to FIGS. 3 and 6, the ball 112, the wire 114 and the capillary 108 may be vertically moved downwardly to attach the ball 112 to an upper surface of the bonding pad 102. The capillary 108 may compress a center of the ball 112 to form a preliminary compressed ball 116 (S20).

In accordance with example embodiments, the preliminary compressed ball 116 may be attached on the bonding pad 102 by a thermo-compression manner using an ultrasonic vibration 110. However, as noted above, example embodiments are not limited to the thermo-compression manner using the ultrasonic vibration 110.

A lower surface of the preliminary compressed ball 116 may be planarized by the upper surface of the bonding pad 102, and an upper surface of the preliminary compressed ball 116 may be formed according to a shape of the front end of the capillary 108. For example, the compressed ball 116 may have dents. In accordance with example embodiments, the lower surface of the preliminary compressed ball 116 may have a substantially smaller area than the upper surface of the bonding pad 102. In example embodiments, the preliminary compressed ball 116 may be formed on one side of the bonding pad 102 with respect to a center of the bonding pad 102. The preliminary compressed ball 116 may expose the bonding pad 102 partially. This may serve to leave a margin to which a compressed ball 120 (see FIG. 4) can be attached on the bonding pad 102.

In example embodiments, the capillary 108 may be moved upwardly. While the capillary 108 is vertically moved upwardly, a neck portion 118 extending upward from the preliminary compressed ball 116 may be formed (S30). The neck portion 118 may be formed using the wire 114 and the compressed ball 120. The neck portion 118 may be between the wire 114 and the preliminary compressed ball 116. Example embodiments, however, are not limited thereto. For example, the neck portion 118 may be formed as the ball 112 is compressed by the capillary 108. Thus, the compressed ball 116 and the neck portion 118 may be simultaneously formed.

In accordance with example embodiments, a width $W_2$ of the neck portion 118 may be substantially larger than a width $W_1$ of the wire 114 installed in the capillary 108 and substantially smaller than a width $W_3$ of the preliminary compressed ball 116 along a direction parallel to an upper surface of the bonding pad 102. However, example embodiments are not limited thereto. For example, the width $W_2$ of the neck portion 118 may have substantially the same thickness of the width $W_1$ of the wire 114.

Referring to FIGS. 4 and 6, the capillary 108 may be moved obliquely and downwardly with respect to the neck portion 118 to compress the neck portion 118 toward the upper portion of the preliminary compressed ball 116. In the alternative, the capillary 108 may be moved vertically upwards, then horizontally to bend the wire 114 and the neck portion 118, and then vertically downwards to compress the wire 114 and the neck portion 118. Example embodiments, however, are not limited the aforementioned operations.

The capillary 108 may be continuously moved obliquely and downwardly with respect to the neck portion 118 to compress the preliminary compressed ball 116 and the compressed neck portion 118, simultaneously. Furthermore the operations of moving the capillary 118 upwards vertically and then obliquely downward may occur several times to compress the preliminary compressed ball 116 multiple times.

In example embodiments, the capillary 108 may compress the neck portion 118 toward an edge of the preliminary compressed ball 116. As such, the capillary 108 may attach the neck portion 118 to the preliminary compressed ball 116 by the thermo-compression manner using the ultrasonic vibration 110 to complete the compressed ball 120 (S40).

The compressed ball 120 may substantially cover an entire upper surface of the bonding pad 102 through the obliquely downward movement of the capillary 108 to the preliminary compressed ball 120. The compressed ball 120 may have a substantially lower height than the preliminary compressed ball 116.

In accordance with example embodiments, the compressed ball 120 may have a disk shape when viewing in a top view thereof. Also, an upper surface of the compressed ball 120 may have a wrinkle or a plurality of wrinkles. In example embodiments, when the upper portion of the ball 112 at the front end of the wire 114 are compressed using the capillary 108 to form the preliminary compressed ball 116 on the bonding pad 102, a first wrinkle (e.g. dents) may be formed on the upper surface of the preliminary compressed ball 120 in contact with the front end of the capillary 108. In addition, when the preliminary compressed ball 116 and the neck portion 118 are compressed together using the capillary 108 to form the compressed ball 120 on the bonding pad 102, a second wrinkle (e.g. dents) may be formed on the upper surface of the compressed ball 120 in contact with the front end of the capillary 108. Accordingly, the first and second wrinkles may have a shape corresponding to the shape of the front end of the capillary 108 and the movement path of the capillary 108.

By moving the capillary 108 obliquely and downwardly as described above, the compressed ball 120 may have a relatively lower height as much as a height of the neck portion 118 of FIG. 3.

Also, a contact area between the compressed ball 120 and the bonding pad 102 may increase, and thus it may be possible to improve reliability of adhesion between the compressed ball 120 and the bonding pad 102.

Referring to FIGS. 5 and 6, the capillary 108 may be moved upward and downward to harden the wire 114 connected with the compressed ball 120 outside the capillary 108. For example, the capillary 108 may be moved upwardly and downwardly to form wrinkles in the wire 114. In example embodiments, vertical rising and falling distances of the capillary 108 may be substantially smaller than a movement distance of the capillary 108 in another process.

The process of moving the capillary 108 upwardly and downwardly to harden the wire 114 connected with the compressed ball 120 may be selectively performed, and may be omitted according to circumstances.

In accordance with example embodiments, the capillary 108 may be moved to the left and right to form wrinkles in the wire 114 and harden the wire 114 connected to the compressed ball 120.

Referring back to FIGS. 1 and 6, the capillary 108 may be moved to extend the wire 114 from one side of the compressed ball 120 toward an electrode pad 106 of the wiring board 104 (S50). For example, the capillary 108 may be vertically moved upwardly and then substantially parallel to the upper surface of the bonding pad 102 to extend the wire 114 from the compressed ball 120 toward the electrode pad 106. In example embodiments the capillary 108 may be configured with clamps which may be disengaged so that the wire in the capillary 108 is supported only laterally. Thus, as the capillary 108 moves away from the compressed ball 120, the wire 114 may be simultaneously fed through the capillary 108 in order to prevent the wire from being pulled off of the bonding pad 102.

A rear end of the extended wire 114 outside the capillary 108 may be attached to an upper surface of the electrode pad 106. In example embodiments, the rear end of the wire 114 may be attached on the electrode pad 106 using the capillary 108. The capillary 108 may attach the rear end of the wire 114 on the electrode pad 106 by the thermo-compression manner using the ultrasonic vibration 110 (S60).

Subsequently, the rear end of the wire 114 outside the capillary 108 may be cut by applying a tension to the capillary 108, so that the wire 114 can be separated from the electrode pad 106 and a portion of the wire 114 remain between the bonding pad 102 and the electrode pad 106. Tension may be applied by engaging the clamps of the capillary 108 so that the wire 114 may be fixed to the capillary 108 as the capillary is pulled away from the electrode pad 106.

As such, the portion of the wire 114 may constitute at least one bonding structure 122 together with the compressed ball 120 according to example embodiments.

As described above, a height of at least one bonding structure from an upper surface of the bonding pad can be reduced to 20 μm to 25 μm, which may be lower than that of the conventional art. In the case that the plurality of semiconductor chips may be sequentially stacked on the wiring board 104, it may be possible to reduce or prevent an electrical defect between the plurality of semiconductor chips resulting from the height of the bonding structures.

Also, a contact area between the preliminary compressed ball and the bonding pad may be increased, and reliability of the at least one bonding structure may be improved.

Figure 7:
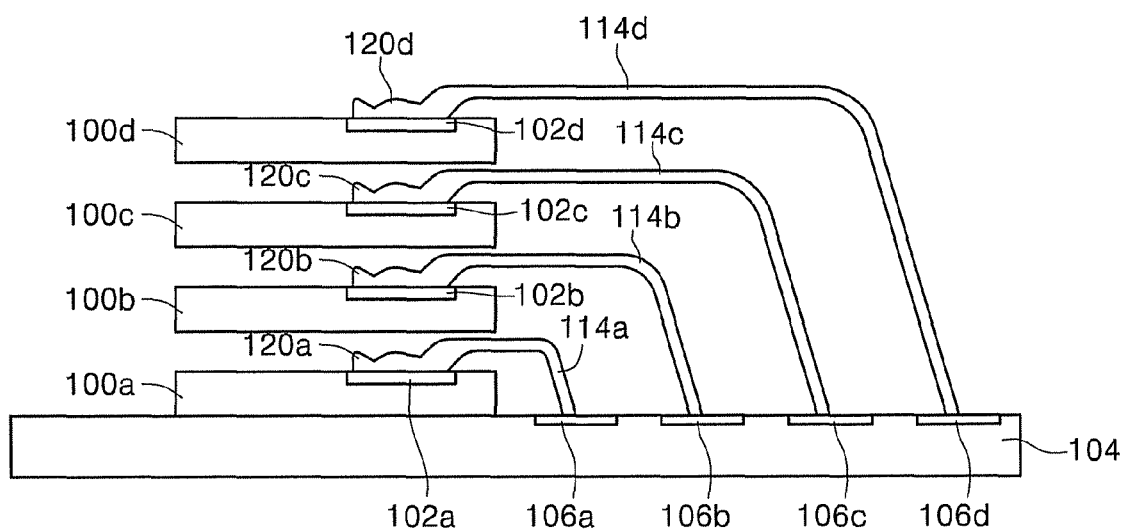
FIG. 7 is an example of a semiconductor device including a plurality of semiconductor chips connected to a wiring board in accordance with example embodiments.

FIG. 7 is an example of a stacked semiconductor device according to example embodiments. As shown in FIG. 7, the semiconductor device may include a wiring board 104 having a plurality of electrode pads 106a, 106b, 106c, and 106d. Mounted on the wiring board 104 is a plurality of semiconductor chips 100a, 100b, 100c, and 100d each having a bonding pad 102a, 102b, 102c, and 102d. As shown in FIG. 7, the plurality of semiconductor chips 100a, 100b, 100c, and 100d may be connected to the plurality of electrode pads 106a, 106b, 106c, and 106d via a plurality of bonding structures comprised of compressed balls 120a, 120b, 120c, and 120d and wires 114a, 114b, 114c, and 114d in accordance with example embodiments. Because the compressed balls 120a, 120b, 120c, and 120d may have heights which are shorter than conventional uncompressed balls, the spacings between the semiconductor chips 100a, 100b, 100c, and 100d may be reduced resulting in a relatively compact stack of chips. This may allow for a relatively highly integrated semiconductor device as compared to the conventional art. Though not shown in the FIG. 7, each of the chips 100a, 100b, 100c, and 100d may be separated by spacers and may be bonded together via a bonding agent, for example, a resin.

Figure 8:
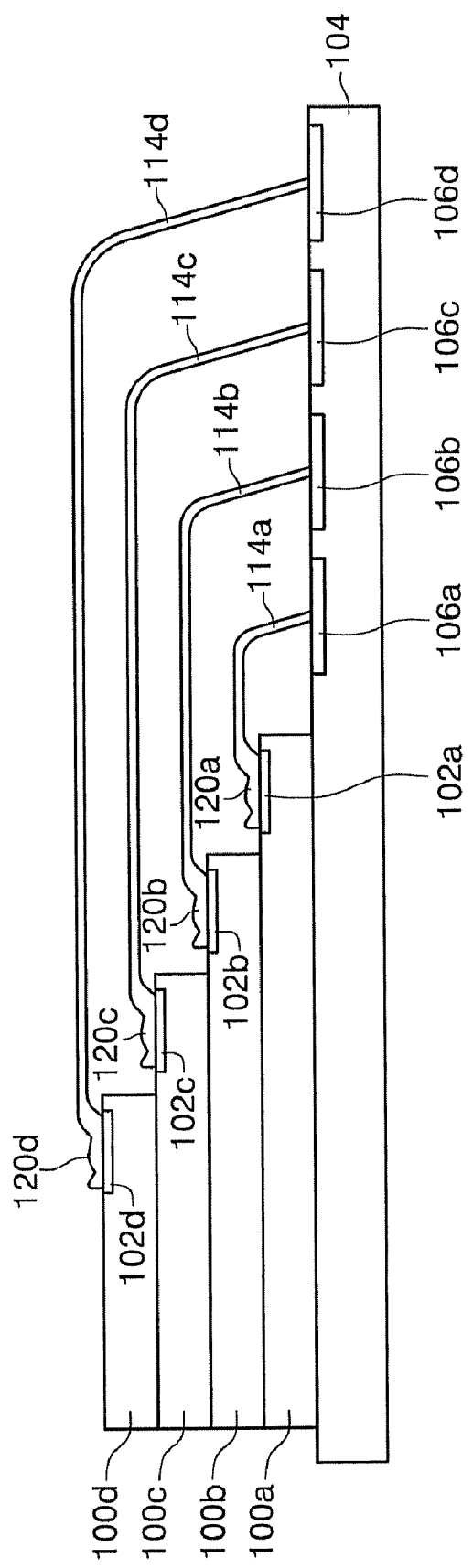
FIG. 8 is an example of a semiconductor device including a plurality of semiconductor chips connected to a wiring board in accordance with example embodiments.

FIG. 8 is an example of a stacked semiconductor device according to example embodiments. As shown in FIG. 8, the semiconductor device may include a wiring board 104 having a plurality of electrode pads 106a, 106b, 106c, and 106d. Mounted on the wiring board 104 is a plurality of semiconductor chips 100a, 100b, 100c, and 100d each having a bonding pad 102a, 102b, 102c, and 102d. As shown in FIG. 8, the plurality of semiconductor chips 100a, 100b, 100c, and 100d may be connected to the plurality of electrode pads 106a, 106b, 106c, and 106d via a plurality of bonding structures comprised of compressed balls 120a, 120b, 120c, and 120d and wires 114a, 114b, 114c, and 114d in accordance with example embodiments. In example embodiments, the chips may be arranged so that each of the bonding pads 102a, 102b, 102c, and 102d is exposed. Because the compressed balls 120a, 120b, 120c, and 120d may have heights which are shorter than conventional uncompressed balls, the spacings between the connecting structures may be increased resulting in fewer opportunities for short circuiting. This may lead to increased reliability in the semiconductor device as compared to the conventional art.

Example embodiments are not limited to semiconductor devices which include only the aforementioned connection structures. For example, in FIG. 8, the semiconductor chip 100d may include a conventional uncompressed ball or a preliminary compressed ball rather than a compressed ball.

Example embodiments are not to be construed as limiting thereof. Although example embodiments have been described, those skilled in the art will readily appreciate that many modifications are possible in example embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to example embodiments disclosed, and that modifications to example embodiments are intended to be included within the scope of the appended claims.

What is claimed is:

1. A method of forming at least one bonding structure, comprising:
    forming a ball at a front end of a wire outside a capillary;
    vertically moving the ball, the wire, and the capillary downwardly to attach the ball to one side of a first pad;
    pressing the capillary against a center of the ball to form a preliminary compressed ball and a neck portion extending from the preliminary compressed ball;
    vertically moving the capillary upwardly to expose the preliminary compressed ball and the neck portion;
    obliquely moving the capillary downwardly with respect to the neck portion to compress the neck portion toward an edge of the preliminary compressed ball to form a compressed ball, the compressed ball substantially covering an entire surface of the first pad and having a wrinkle on an upper surface thereof;
    moving the capillary from the first pad to a second pad to extend the wire from the compressed ball; and
    forming a rear end of the at least one bonding structure by moving the capillary towards the second pad to press the wire against the second pad.

2. The method according to claim 1, wherein obliquely moving the capillary downwardly includes
    obliquely moving the capillary downwardly with respect the neck portion to attach the neck portion to the edge of the preliminary compressed ball, and
    continuously moving the capillary obliquely and downwardly with respect to the neck portion to compress the attached neck portion and the preliminary compressed ball together.

3. The method according to claim 1, wherein moving the capillary from the first pad to a second pad to extend the wire from the compressed ball includes
    moving the capillary vertically upward, and
    moving the capillary parallel to an upper surface of the first pad.

4. The method according to claim 1, further comprising:
    vertically moving the capillary upwardly and downwardly to press the wire against the first pad thereby hardening the wire outside the capillary.

5. The method according to claim 1, wherein forming the rear end of the bonding structure includes using thermocompression with ultrasonic vibration.

6. The method according to claim 1, wherein the first pad is a bonding pad on a semiconductor chip.

7. The method according to claim 6, wherein the second pad is an electrode pad on a wiring board.

8. The method according to claim 7, wherein the semiconductor chip is on the wiring board and the semiconductor chip exposes the second pad.

9. The method according to claim 8, further comprising:
    pulling the wire so that the rear end of the wire remains attached to the second pad and a remaining portion of the wire is separated from the rear end of the wire;
    forming a second ball at a front end of the remaining portion of the wire outside the capillary;
    vertically moving the second ball, the remaining portion of the wire, and the capillary downwardly to attach the second ball to one side of a third pad;
    pressing the capillary against a center of the second ball to form a second preliminary compressed ball and a second neck portion extending from the second preliminary compressed ball;
    vertically moving the capillary upwardly to expose the second preliminary compressed ball and the second neck portion;
    obliquely moving the capillary downwardly with respect to the second neck portion to compress the second neck portion toward an edge of the second preliminary compressed ball to form a second compressed ball, the second compressed ball substantially covering an entire surface of the third pad and having a wrinkle on an upper surface thereof;
    moving the capillary from the third pad to a fourth pad to extend the remaining portion of the wire from the second compressed ball; and
    forming a second rear end of the at least one bonding structure by moving the capillary towards the fourth pad to press the remaining portion of the wire against the fourth pad.

10. The method according to claim 1, wherein forming the compressed ball includes forming the compressed ball to have a height of about 20 to 25 um from an upper surface of the first pad.

11. The method according to claim 10, wherein the compressed ball is formed to substantially cover an entire upper surface of the first pad and is formed to have a wrinkle on an upper surface thereof.

12. The method according to claim 11, wherein the wrinkle is formed by pressing the center of the ball using a front end of the capillary and obliquely moving the capillary downwardly.

13. The method according to claim 12, wherein pressing the center of the ball using the front end of the capillary forms at least one dent on an upper surface of the preliminary compressed ball adjacent to the neck portion.

14. The method according to claim 13, wherein obliquely moving the capillary downwardly forms at least one dent on the upper surface of the compressed ball using the front end of the capillary.

15. The method according to claim 14, wherein the first pad is a bonding pad, and electrically connects at least one semiconductor chip, in which a memory device and a logic device are formed, with the outside.

16. The method according to claim 15, wherein the second pad is an electrode pad, and electrically connects a wiring board with the first pad through the at least one bonding structure.

* * * * *